(12) United States Patent
Chen et al.

(10) Patent No.: US 8,354,714 B2
(45) Date of Patent: Jan. 15, 2013

(54) SOI MOS DEVICE HAVING BTS STRUCTURE AND MANUFACTURING METHOD THEREOF

(75) Inventors: Jing Chen, Shanghai (CN); Jiexin Luo, Shanghai (CN); Qingqing Wu, Shanghai (CN); Xiaolu Huang, Shanghai (CN); Xi Wang, Shanghai (CN)

(73) Assignee: Shanghai Institute of Microsystem and Information Technology, Chinese Academy of Sciences, Changning District, Shanghai (CN)

( * ) Notice: Subject to any disclaimer, the term of this patent is extended or adjusted under 35 U.S.C. 154(b) by 0 days.

(21) Appl. No.: 13/132,879

(22) PCT Filed: Sep. 7, 2010

(86) PCT No.: PCT/CN2010/076678
§ 371 (c)(1),
(2), (4) Date: Jun. 3, 2011

(87) PCT Pub. No.: WO2012/006805
PCT Pub. Date: Jan. 19, 2012

(65) Prior Publication Data
US 2012/0012931 A1     Jan. 19, 2012

(30) Foreign Application Priority Data
Jul. 13, 2010 (CN) .......................... 2010 1 0225623

(51) Int. Cl.
*H01L 29/76* (2006.01)
*H01L 31/062* (2012.01)

(52) U.S. Cl. ......... 257/336; 257/347; 257/348; 438/151
(58) Field of Classification Search .................. 257/336, 257/347–348, E29.268, E21.424; 438/151
See application file for complete search history.

(56) References Cited

U.S. PATENT DOCUMENTS
5,254,490 A * 10/1993 Kondo .......................... 438/297
7,943,961 B2 * 5/2011 Wang et al. .................. 257/178

* cited by examiner

*Primary Examiner* — Theresa T Doan
(74) *Attorney, Agent, or Firm* — Global IP Services; Tianhua Gu

(57) ABSTRACT

The present invention discloses a SOI MOS device having BTS structure and manufacturing method thereof. The source region of the SOI MOS device comprises: two heavily doped N-type regions, a heavily doped P-type region formed between the two heavily doped N-type regions, a silicide formed above the heavily doped N-type regions and the heavily doped P-type region, and a shallow N-type region which is contact to the silicide; an ohmic contact is formed between the heavily doped P-type region and the silicide thereon to release the holes accumulated in body region of the SOI MOS device and eliminate floating body effects thereof without increasing the chip area and also overcome the disadvantages such as decreased effective channel width of the devices in the BTS structure of the prior art. The manufacturing method comprises steps of: forming a heavily doped P-type region via ion implantation, forming a metal layer above the source region and forming a silicide via the heat treatment between the metal layer and the Si underneath. The device in the present invention could be fabricated via simplified fabricating process with great compatibility with traditional CMOS technology.

10 Claims, 4 Drawing Sheets

SOI MOS DEVICE HAVING BTS STRUCTURE AND MANUFACTURING METHOD THEREOF

CROSS REFERENCE TO RELATED PATENT APPLICATION

The present application is the US national stage of PCT/CN2010/076678 filed on Sep. 7, 2010, which claims the priority of the Chinese patent application No. 201010225623.0 filed on Jul. 13, 2010, which application is incorporated herein by reference.

FIELD OF THE INVENTION

The present invention relates to a manufacturing method of a MOS (Metal Oxide Semiconductor) structure, more particularly to a SOI MOS device having BTS structure and manufacturing method thereof, which belongs to semiconductor manufacturing field.

BACKGROUND OF THE INVENTION

SOI means silicon on insulator. In SOI technique, devices usually are fabricated in a thin silicon film and a buried oxide layer (BOX) is disposed between the device and the substrate to separate them. Comparing to traditional bulk silicon, SOI technology has many advantages, such as reduced parasitic capacitance making SOI device provide higher speed and consume less power, full dielectric isolation of the SOI CMOS device eliminating the occurrence of bulk-Si CMOS device parasitic latch-up effects and making SOI technique have superior performances including high integration density, and good anti-irradiation properties. SOI technique has been widely applied in many technical fields such as radio-frequency, high voltage and anti-irradiation. With the size of the device continuing to shrink, SOI technique will be probably the first choice of Si technique instead of bulk silicon.

According to whether the active body region is depleted, SOI MOS can be classified into partially depleted SOI MOS (PDSOI) and fully depleted SOI MOS (FDSOI). Generally, the top silicon film of fully depleted SOI MOS is thinner leading to many disadvantages. In one hand, the thin silicon film has high cost, and in the other hand, the threshold voltage of the fully depleted SOI MOS is hard to control. Therefore, the partially depleted SOI MOS is general adopted currently.

The active body region of PDSOI (Partially Depleted SOI) is partially depleted which makes the body region appear in suspending state and the electric charge caused by impact ionization can't be removed rapidly, resulting in floating body effect which is the special characteristic of SOI MOS. For the electron-hole pairs produced via collision of the SOI MOS channel electrons, the holes will move to the body region. The floating body effect of SOI MOS will result in the accumulation of holes in the body region to raise the electric potential of the body region. Due to the body effect, the threshold voltage of SOI NMOS is reduced and the leakage current is increased resulting in the warping displacements of the output characteristic curve $I_dV_d$, known as the Kink effect. Kink effect having negative effects on the performances and reliabilities of the device and the circuit should be eliminated. The Kink effects of SOI PMOS device is not so obvious because the electron-hole pairs produced via collision is much less than SOI NMOS due to the lower ionization rate of the holes.

In order to resolve the problem of partially depleted SOI MOS, the method of body contact is usually adopted to connect the "body" to the fixed electric potential such as the source region or the ground. Referring to FIG. 1a-1b, in the traditional T-type gate structure body-contact, the $P^+$ implantation region formed in one side of the T-type gate is contact to the P-type body region. During the operation of the MOS devices, the carriers accumulated in the body region release via flowing through the $P^+$ channel to reduce electric potential of the body region. However, there are still some disadvantages such as complex manufacturing process, increased parasitic effect, degraded electric properties and increased device area. Therefore, the BTS (Body Tied to Source) structure, i.e. there is a conductive terminal in the source for leading out the accumulated holes in the body region, is provided to overcome the foregoing disadvantages. The BTS structure could effectively eliminating body floating effects without increasing the chip area. However, the BTS structure in the prior art always results in the asymmetry of the MOS devices and decreased effective channel width of the devices.

Therefore, in order to eliminate floating body effects of SOI MOS devices, there is a need for an improved BTS structure which could eliminate floating effects without decreasing the effective channel width of the devices and could be fabricated through a simple manufacturing process compatible with conventional CMOS process via silicide technology.

SUMMARY OF THE INVENTION

Consistent with embodiments of the present invention, a SOI MOS device having BTS structure and manufacturing method thereof is provided. The SOI MOS device having BTS structure comprises:
  a semiconductor substrate, a buried oxide layer (BOX) formed on the semiconductor substrate;
  an active region formed on the buried oxide layer, including a gate region, a body region formed under the gate region, an N-type source region and an N-type drain region which are located on the two opposite ends of the body region, and an insulation spacer formed surrounding the gate region; and
  an shallow trench isolation region formed surrounding the active region;
  wherein the N-type source region comprises: two heavily doped N-type regions; a heavily doped P-type region formed between the two heavily doped N-type regions; a silicide formed on, which is also contact to, the heavily doped N-type regions and the heavily doped P-type region; a shallow N-type region which is contact to the silicide; the heavily doped P-type region is contact to all of the two heavily doped N-type regions, the shallow trench isolation region, the body region and the silicide thereon.

Preferably, the silicide is made of the material selected from cobalt silicide or titanium silicide.

Preferably, the body region is made of the P-type Si material.

Preferably, the buried insulation layer comprises silicon oxide or silicon nitride.

The manufacturing method of a SOI MOS device having BTS structure is provided in the present invention. The manufacturing method comprises steps of:
  (a) forming a shallow trench isolation structure on a Si material having a buried insulation layer to isolate a Si material region, and creating a gate region on the Si material region;

(b) performing source and drain light doping process to form a lightly doped N-type source region and a lightly doped N-type drain region;

(c) providing an insulation spacer around the gate region, wherein the insulation spacer covers a part of the surfaces of the lightly doped N-type source region and the lightly doped N-type drain region, then forming an N-type Si material source region and an N-type drain region via source and drain ion implantation, and forming a body region between the N-type Si material source region and the N-type drain region; wherein the N-type Si material source region is composed of a shallow N-type region and a heavily doped N-type region which are located under the insulation spacer;

(d) implanting ions underneath from the part of the N-type Si material source region's surface that is not covered by the insulation spacer via ion implantation to form a heavily doped P-type region in the middle of the heavily doped N-type region, wherein the heavily doped P-type region dividing the heavily doped N-type region into two heavily doped N-type regions located separately;

(e) forming a metal layer on the surface of the heavily doped P-type region and the two heavily doped N-type regions, and then allowing the reaction between the metal layer and the Si material underneath to form a silicide by heat treatment and proceeding the reaction until the silicide formed being contact to the heavily doped P-type region and the two heavily doped N-type regions; and an N-type source region being formed by the silicide, the heavily doped P-type region, two heavily doped N-type regions and the shallow N-type region.

Preferably, in step (a), P-ion implantation in the Si material region isolated is performed firstly before creating the gate region.

Preferably, in step (b), the implantation dose of the lightly source and drain region doping could reach the magnitude of 1e15/cm², and the concentration of the lightly doped N-type source region and the lightly doped N-type drain region could reach the magnitude of 1e19/cm³.

Preferably, in step (d), a mask with an opening thereon which is aligned with the edge of the insulation spacer in the middle of the heavily doped N-type region is adopted to perform heavily doped P ion implantation vertically underneath to form a heavily doped P-type region.

Preferably, in step (e), the metal layer is formed of the metal selected from Co or Ti; and the furnace annealing procedure is adopted in the said heat treatment reaction, the temperature of heat treatment is ranging from 700 to 900 and the time of the heat treatment is ranging from 50 seconds to 70 seconds.

A SOI MOS device having BTS structure and manufacturing method thereof is provided in the present invention. The advantages of the present invention are listed as below. The SOI MOS device has improved BTS structure, and there are two divided heavily doped N-type regions in the source region, a heavily doped P-type region formed between these two heavily doped N-type regions and a silicide formed on the mentioned heavily doped N-type regions and heavily doped P-type region. There is an ohmic contact, which is formed between the heavily doped P-type region and the silicide thereon, could release the holes accumulated in body region of the SOI MOS device and eliminate floating body effects thereof. Besides, these two heavily doped N-type region which are covered by the silicide could effectively eliminate floating body effects without increasing the chip area and also overcome the disadvantages such as decreased effective channel width of the devices in the BTS structure of the prior art. Furthermore, the devices in the present invention could be fabricated via simplified fabricating process with great compatibility with traditional CMOS technology.

BRIEF DESCRIPTION OF THE DRAWINGS

FIG. 2a-2d show the systematic structure of the SOI MOS device having BTS structure, wherein FIG. 2a is a top view of the device and FIG. 2b-2d is the sectional view showing the section A-A', B-B' and C-C' respectively; the silicide in FIG. 2a is not shown.

DETAILED DESCRIPTION OF THE EMBODIMENTS

Figure 1A:
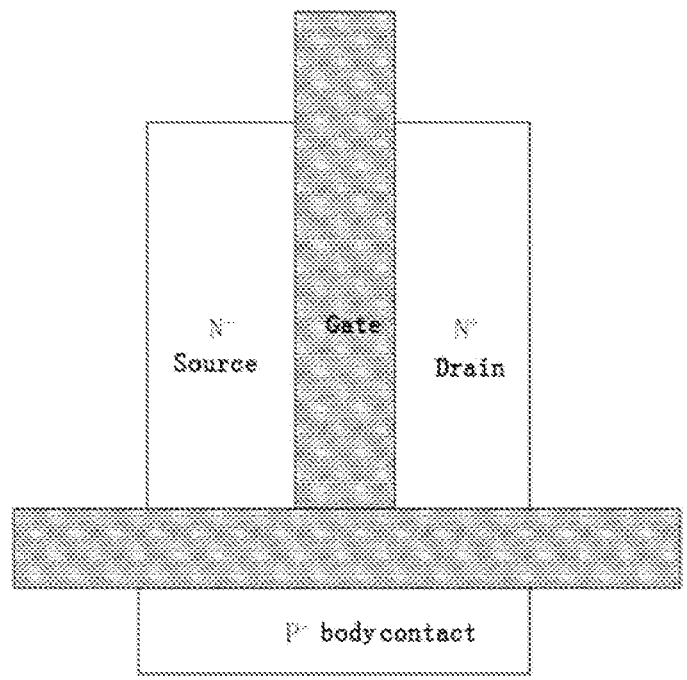
FIG. 1a is a top view of the MOS structure adopting body contact method to eliminate floating body effects in the prior art.
Figure 1B:
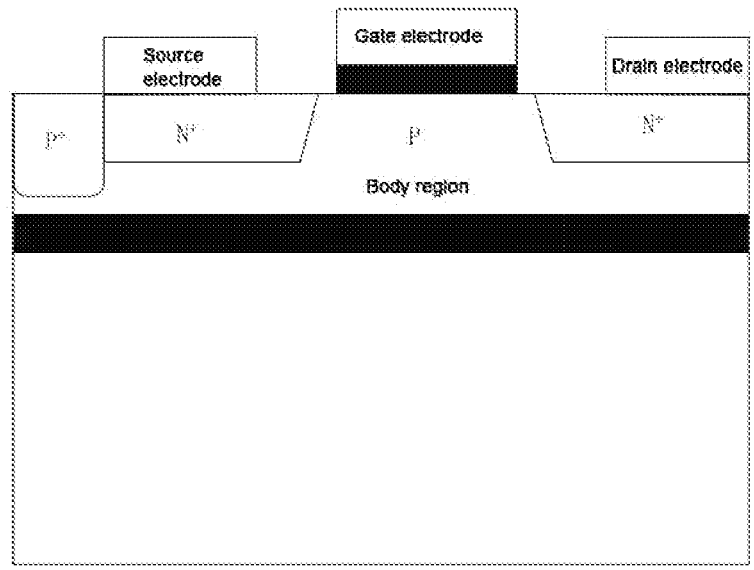
FIG. 1b is a cross sectional view of the MOS structure adopting body contact method to eliminate floating body effects in the prior art.

The present invention is further explained in detail according to the accompanying drawings.

First Embodiment

FIG. 2a-2d show the systematic structure of a SOI MOS device having BTS structure, and the SOI MOS device includes: a semiconductor substrate 10, a buried oxide layer (BOX) 20 formed on the semiconductor substrate 10; an active region formed on the buried oxide layer 20 and a shallow trench isolation (STI) region 30 formed surrounding the active region.

The active region includes a gate region, a body region 70 formed under the gate region, an N-type source region and an N-type drain region 40 which are located on the two opposite ends of the body region 70, and the N-type source region and the N-type drain region 40 are located on the opposite side of the gate region.

The N-type source region includes: two heavily doped N-type regions 52 and 53, a heavily doped P-type region 60, a silicide 51 and a shallow N-type region 54. The heavily doped P-type region 60 is formed between the heavily doped N-type region 52 and the heavily doped N-type region 53. The silicide 51 is formed on, which is also contact to, the heavily doped N-type region 52, the heavily doped N-type region 53 and the heavily doped P-type region 60. The shallow N-type region 54 is contact to the silicide 51. The heavily doped P-type region 60 is contact to the two heavily doped N-type regions 52 and 53, the shallow trench isolation region 30 and the body region 70. In addition, an ohmic connection is formed between the heavily doped P-type region 60 and the silicide 51 thereon.

In the device of the present embodiment, the gate region includes a gate dielectric layer 81 and a gate electrode 82 formed above the gate dielectric layer 81. An insulation spacer 90 is formed surrounding the gate region. The active region is made of Si material. The body region 70 could be made of P-type Si material and the N-type drain region 40 could be made of N-type Si material. The buried insulation layer 20 could be made of the material selected from silicon dioxide or silicon nitride. Consistent with a specific embodiment of the present invention, silicon dioxide is adopted to form a buried oxide layer (BOX). The silicide 51 could be made of any kind of conductive silicides, such as, for example, cobalt silicide or titanium silicide, in order to release the holes accumulated in body region of the SOI MOS device and eliminate floating body effects thereof by forming an ohmic contact with the heavily doped P-type region 60 underneath. Besides, the heavily doped N-type regions 52 and 53 are covered by the silicide 51, this structure could effectively eliminate floating body effects without increasing the chip area and also overcome the disadvantages such as decreased effective channel width of the devices in the BTS structure of the prior art. The Kink effects of SOI PMOS device is not so obvious in SOI PMOS devices, therefore, the technical solution in the present is mainly concerned about SOI NMOS devices.

Figure 3A:
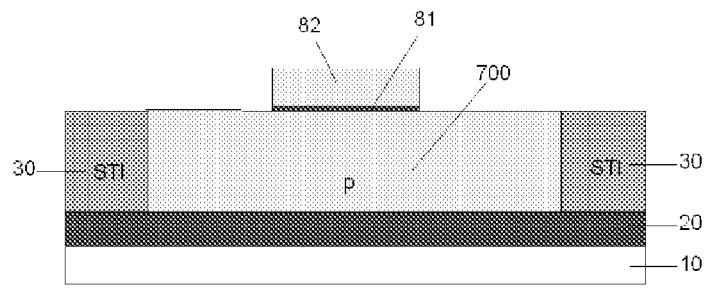
FIG. 3a-3f is the technical flow chart for fabricating the SOI MOS device having BTS structure adopting the preparation method of the present invention.

Referring to FIG. 3a to 3f, the fabrication method of the SOI MOS device having BTS structure in the present invention includes the following steps:

(a) referring to FIG. 3a, firstly form a shallow trench isolation structure 30 on a Si material (SOI) having the buried insulation layer 20 to isolate a Si material region 700, and create a gate region on the Si region 700, i.e. create a gate dielectric layer 81 and a gate electrode 82 successively above the Si material region 700; wherein the gate electrode 82 is made of polycrystalline silicon material, and before the gate region is created, P ion implantation is proceeded to the active region to adjust the threshold voltage.

Figure 3B:
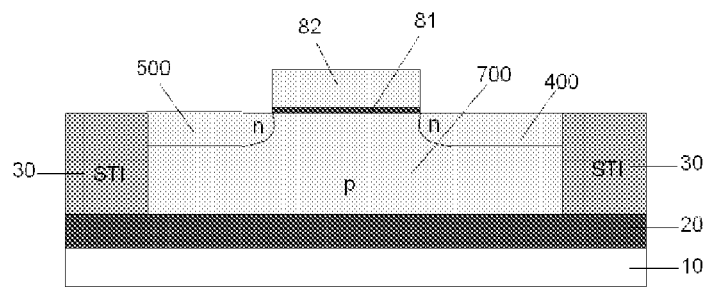
Figure 3C:
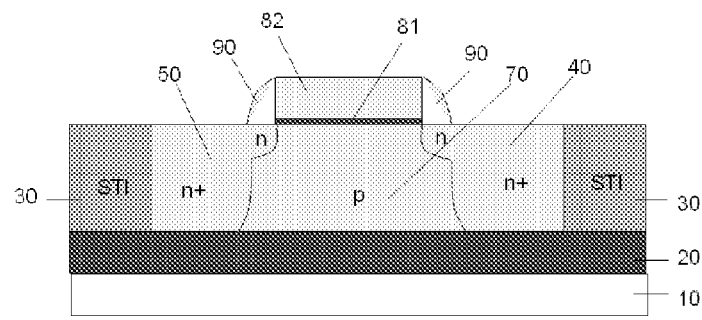
Figure 3D:
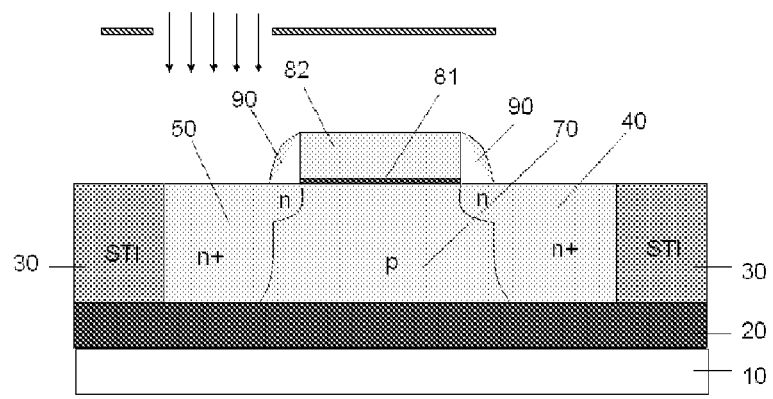

(b) referring to FIG. 3b, proceed high dose light source doping (LDS) and light drain doping (LDD) respectively; the difference between the method of the present invention and traditional LDD/LDS process is the implantation dosage, for example, the actual implantation dose of the source and drain light doping in the present invention reaches a volume level of $1e15/cm^2$, which could be called as "highly doped source and drain", therefore, both of the lightly doped N-type source region 500 and the lightly doped N-type drain region 400 have higher doping concentration which could reach a volume level of $1e19/cm^3$. However, in order to distinguish it from the source and drain implantation, the process in the present invention is still named as "LDD/LDS" which has been adopted in the industry.

Figure 2A:
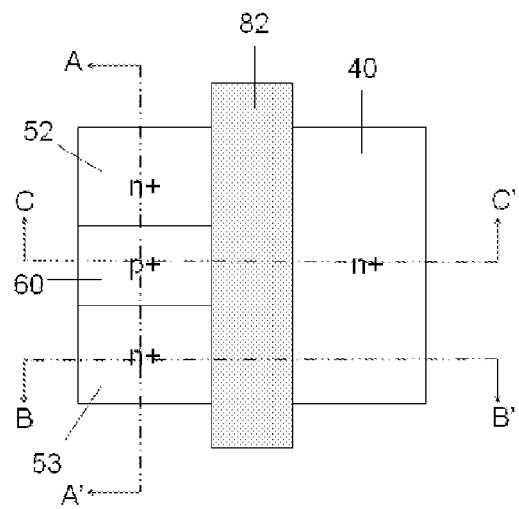
Figure 2B:
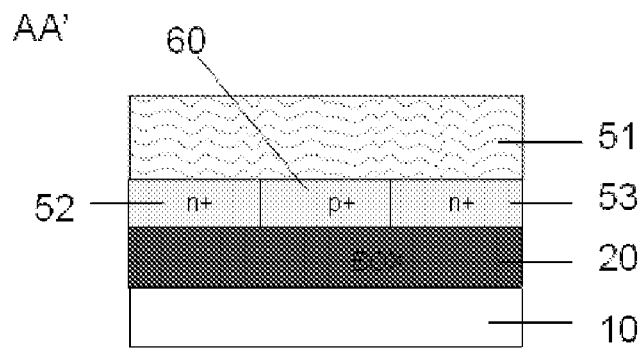
Figure 2C:
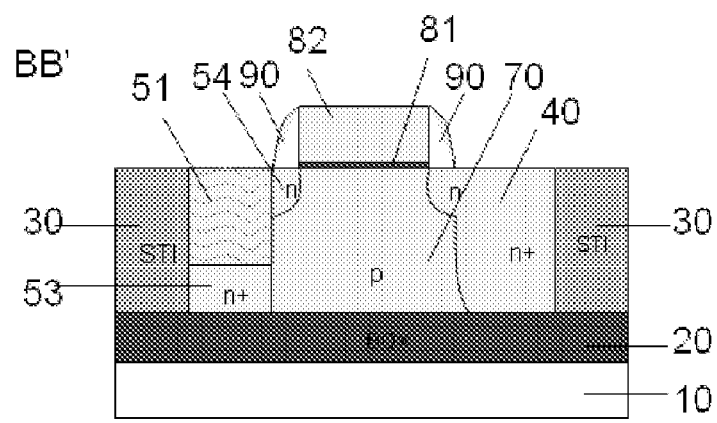

(c) referring to FIG. 2c, fabricate an insulation spacer 90 surrounding the gate region adopting material, such as, for example, silicon dioxide or silicon nitride. The insulation spacer 90 covers a part of the surfaces of the lightly doped N-type source region 500 and the lightly doped N-type drain region 400. After that, form an N-type Si material source region 50 and an N-type drain region 40 via once source and drain ion implantation procedure; and form a body region 70 between the N-type Si material source region 50 and the N-type drain region 40; the N-type Si material source region 50 is composed of a shallow N-type region and a heavily doped N-type region which are located under the insulation spacer 90.

Figure 2D:
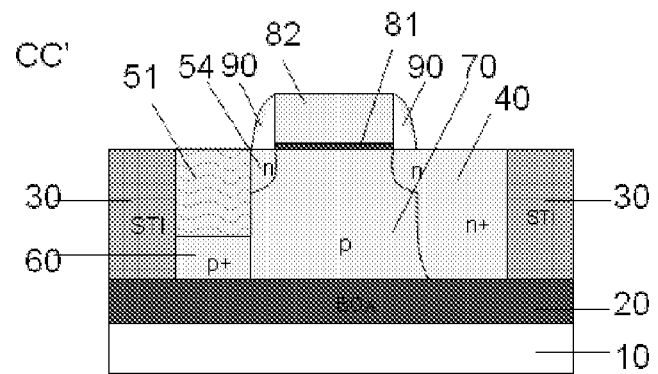
Figure 3E:
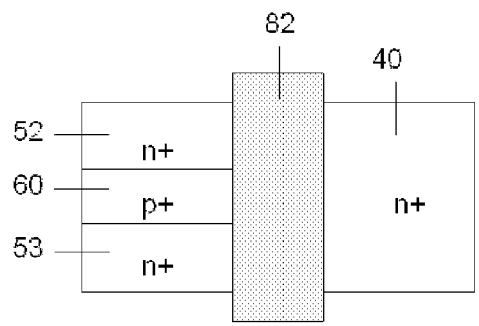

(d) referring to FIG. 2d, implant ions underneath from the surface of the N-type Si material source region 50, which is not covered by the spacer structure 90, via ion implantation to form a heavily doped P-type region 60 in the middle of the heavily doped N-type region, the heavily doped P-type region 60 divides the heavily doped N-type region into two heavily doped N-type regions, that is, the heavily doped N-type region 52 and the heavily doped N-type region 53, which are located separately, shown as FIG. 3e. Consistent with one specific embodiment of the present invention, a mask with an opening at the middle position of the heavily doped N-type Si source region could be adopted. In addition, the opening of the mask also aligns to the edge of the insulation spacer 90. By performing heavily doped P ion implantation vertically via the mask, the heavily doped P-type body contact region 60 can be formed.

Figure 3F:
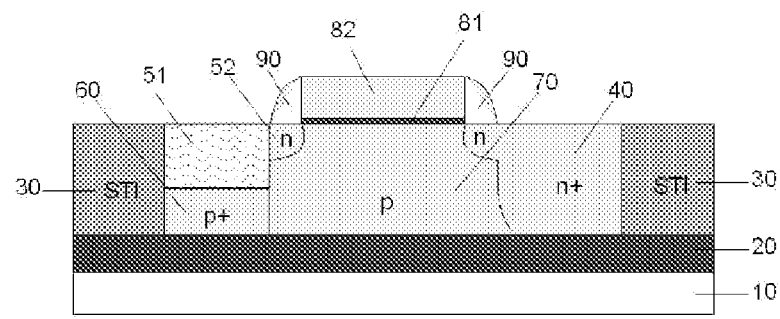

(e) form a metal layer, such as, for example, a Co layer or Ti layer, on the surface of the heavily doped P-type region 60 and the two heavily doped N-type region 52 and 53, then allow the reaction between the metal layer and the remained Si material underneath to form the silicide 51 by heat treatment, and proceed the reaction until the silicide 51 formed being contact to the heavily doped P-type region 60 and the two heavily doped N-type region 52 and 53; and an N-type source region being formed by the obtained silicide 51, the heavily doped P-type region 60, two heavily doped N-type region 52 and 53 and the shallow N-type region 54. Finally, the fabrication process of the MOS device structure as shown in FIG. 3f is completed. During the heat treatment in the present invention, the furnace annealing procedure is adopted, and the temperature of heat treatment is between 700 and 900, preferably 800; and the time of the heat treatment is between 50 seconds to 70 seconds, preferably 60 seconds; the silicide 51 could be cobalt silicide which is obtained from the reaction between Co and Si, or titanium silicide which is obtained from the reaction between Ti and Si.

The devices in the present invention could be fabricated via simplified fabricating process with great compatibility with traditional CMOS technology. The simplicity of the device fabrication as disclosed above makes implementation of the technique practical.

The above description of the detailed embodiments are only to illustrate the preferred implementation according to the present invention, and it is not to limit the scope of the present invention, Accordingly, all modifications and variations completed by those with ordinary skill in the art should fall within the scope of present invention defined by the appended claims.

What is claimed is:

1. A SOI MOS device having body tied to source (BTS) structure comprises:
   a semiconductor substrate;
   a buried oxide layer (BOX) formed on the semiconductor substrate;
   an active region formed on the buried oxide layer, including a gate region, a body region formed under the gate region, an N-type source region and an N-type drain region which are located on the two opposite ends of the body region, and an insulation spacer formed surrounding the gate region; and
   an shallow trench isolation region formed surrounding the active region;
   wherein the N-type source region comprises: two heavily doped N-type regions; a heavily doped P-type region formed between the two heavily doped N-type regions; a silicide formed on, which is also contact to, the two heavily doped N-type regions and the heavily doped P-type region; a shallow N-type region which is contact to the silicide; the heavily doped P-type region is contact to all of the two heavily doped N-type regions, the shallow trench isolation region, the body region and the silicide thereon.

2. A The SOI MOS device having body tied to source (BTS) structure in claim 1, wherein the silicide is made of the material selected from cobalt silicide or titanium silicide.

3. A The SOI MOS device having body tied to source (BTS) structure in claim 1, wherein the body region is made of the P-type Si material.

4. A method of manufacturing a SOI MOS device having body tied to source (BTS) structure comprises steps of:
   (a) forming a shallow trench isolation structure on a Si material having a buried insulation layer to isolate a Si material region, and creating a gate region on the Si material region;
   (b) performing source and drain light doping process to form a lightly doped N-type source region and a lightly doped N-type drain region;
   (c) providing an insulation spacer around the gate region, wherein the insulation spacer covers part of the surfaces of the lightly doped N-type source region and the lightly doped N-type drain region, then forming an N-type Si material source region and an N-type drain region via source and drain ion implantation, and forming a body region between the N-type Si material source region and the N-type drain region; wherein the N-type Si material source region is composed of a shallow N-type region and a heavily doped N-type region which are located under the insulation spacer;
   (d) implanting ions underneath from the part of the N-type Si material source region's surface that is not covered by the insulation spacer via ion implantation to form a heavily doped P-type region in the middle of the heavily doped N-type region, wherein the heavily doped P-type region dividing the heavily doped N-type region into two heavily doped N-type regions located separately;
   (e) forming a metal layer on the surface of the heavily doped P-type region and the two heavily doped N-type regions, and then allowing the reaction between the metal layer and the Si material underneath to form a silicide by heat treatment and proceeding the reaction until the silicide formed being contact to the heavily doped P-type region and the two heavily doped N-type regions; and an N-type source region being formed by the silicide, the heavily doped P-type region, two heavily doped N-type regions and the shallow N-type region.

5. The method of manufacturing a SOI MOS device having body tied to source (BTS) structure in claim 4, wherein in step (a), P-ion implantation in the Si material region isolated is performed firstly before creating the gate region.

6. The method of manufacturing a SOI MOS device having body tied to source (BTS) structure in claim 4, wherein in step (b), the implantation dose of the lightly source and drain region doping could reach the magnitude of $1e15/cm^2$, and the concentration of the lightly doped N-type source region and the lightly doped N-type drain region could reach the magnitude of $1e19/cm^3$.

7. The method of manufacturing a SOI MOS device having body tied to source (BTS) structure in claim 4, wherein in step (d), a mask with an opening thereon which is aligned with the edge of the insulation spacer in the middle of the heavily doped N-type region is adopted to perform heavily doped P ion implantation vertically to form a heavily doped P-type region.

8. The method of manufacturing a SOI MOS device having body tied to source (BTS) structure in claim 4, wherein in step (e), the metal layer is formed of the metal selected from Co or Ti.

9. The method of manufacturing a SOI MOS device having body tied to source (BTS) structure in claim 4, wherein in step (e), furnace annealing procedure is adopted in the heat treatment.

10. The method of manufacturing a SOI MOS device having body tied to source (BTS) structure in claim 4, wherein in step (e), the temperature of heat treatment is ranging from 700 to 900 and the time of the heat treatment is ranging from 50 seconds to 70 seconds.

* * * * *